United States Patent
Fukuhara et al.

(10) Patent No.: US 8,610,450 B2
(45) Date of Patent: Dec. 17, 2013

(54) METHOD OF MEASURING ELECTRICAL CHARACTERISTICS OF SEMICONDUCTOR WAFER

(75) Inventors: Noboru Fukuhara, Tsukuba (JP); Masahiko Hata, Tsuchiura (JP)

(73) Assignee: Sumitomo Chemical Company, Limited, Tokyo (JP)

(*) Notice: Subject to any disclaimer, the term of this patent is extended or adjusted under 35 U.S.C. 154(b) by 249 days.

(21) Appl. No.: 13/273,781

(22) Filed: Oct. 14, 2011

(65) Prior Publication Data

US 2012/0032699 A1 Feb. 9, 2012

Related U.S. Application Data

(63) Continuation-in-part of application No. PCT/JP2010/002659, filed on Apr. 13, 2010.

(30) Foreign Application Priority Data

Apr. 15, 2009 (JP) ................................. 2009-099406

(51) Int. Cl.
*G01R 31/26* (2006.01)

(52) U.S. Cl.
USPC .................................... 324/762.05

(58) Field of Classification Search
USPC ................. 324/762.01–762.1, 750.01–750.3; 257/48; 438/14–18
See application file for complete search history.

(56) References Cited

U.S. PATENT DOCUMENTS

| 6,525,544 B1 * | 2/2003 | Okada ........................... 324/551 |
| 7,956,608 B1 * | 6/2011 | Wessels et al. ................ 324/252 |

FOREIGN PATENT DOCUMENTS

| JP | 2-241047 A | 9/1990 |
| JP | 11-345812 A | 12/1999 |
| JP | 2001-007320 A | 1/2001 |
| JP | 2001-274211 A | 10/2001 |
| JP | 2006-179861 A | 7/2006 |
| JP | 2008-288474 A | 11/2008 |

OTHER PUBLICATIONS

International Preliminary Report on Patentability for corresponding International Patent Application No. PCT/JP2010/002659 mailed Nov. 24, 2011.

* cited by examiner

*Primary Examiner* — Tung X Nguyen
(74) *Attorney, Agent, or Firm* — Sughrue Mion, PLLC

(57) ABSTRACT

There is provided a method of measuring a leakage current or a dielectric breakdown voltage of a semiconductor wafer that has a base wafer and a buffer layer formed on the base wafer. The method includes providing, on the buffer layer, a plurality of electrodes including a hole injection electrode made of a material that injects a hole into the buffer layer when an electric field is applied thereto, measuring an electric current flowing through a pair of electrodes or a voltage between the electrodes when a voltage or an electric current is applied to the pair of electrodes, the electrodes including at least one hole injection electrode, and measuring a leakage current or a dielectric breakdown voltage caused by hole migration in the semiconductor wafer based on the current flowing through the pair of electrodes or the voltage generated between the pair of the electrodes.

13 Claims, 10 Drawing Sheets

METHOD OF MEASURING ELECTRICAL CHARACTERISTICS OF SEMICONDUCTOR WAFER

The contents of the following Japanese patent application and PCT patent application are incorporated herein by reference:
JP2009-099406 filed on Apr. 15, 2009, and
PCT/JP2010/002659 filed on Apr. 13, 2010.

TECHNICAL FIELD

The present invention relates to measuring electrical characteristics of a semiconductor wafer.

BACKGROUND ART

Patent Document 1 describes a resistivity measuring method in which a resistivity of a monocrystalline silicon thin film is measured by a four probe method. The resistivity measuring method described in Patent Document 1 does not consider a type of a carrier. Patent Document 1: JP2001-274211A

SUMMARY OF THE INVENTION

Problem to be Solved by the Invention

However, among various semiconductor devices such as field effect transistors (also referred to as "FETs"), there are some electronic devices in which electric current flows with a monocarrier which is either an electron or a hole. In order to more accurately evaluate electrical characteristics of a semiconductor wafer, it is preferable to adopt a measuring method which is capable of measuring electrical characteristics for a carrier of either an electron or a hole, in addition to conventional measuring methods.

Means for Solving Problem

For a solution to the above-mentioned problems, according to the first aspect related to the present invention, provided is one exemplary method of measuring a leakage current or a dielectric breakdown voltage of a semiconductor wafer that has a base wafer and a buffer layer formed on the base wafer. The method includes providing, on the buffer layer, a plurality of electrodes including a hole injection electrode made of a material that injects a hole into the buffer layer when an electric field is applied thereto; measuring an electric current flowing through a first pair of electrodes or a voltage generated between the electrodes of the first pair when a voltage or an electric current is applied to the first pair of electrodes, the first pair of electrodes being selected from the plurality of electrodes and including at least one hole injection electrode; and measuring a leakage current or a dielectric breakdown voltage caused by hole migration in the semiconductor wafer based on the current flowing through the first pair of electrodes or the voltage generated between the electrodes of the first pair.

The method can further include providing, on the buffer layer, a plurality of electrodes including an electron injection electrode made of a material that injects an electron into the buffer layer when an electric field is applied thereto; measuring an electric current flowing through a second pair of electrodes or a voltage generated between the electrodes of the second pair when a voltage or an electric current is applied to the second pair of electrodes, the second pair of electrodes being selected from the plurality of electrodes and including at least one electron injection electrode; and measuring a leakage current or a dielectric breakdown voltage caused by electron migration in the semiconductor wafer based on the current flowing through the second pair of electrodes or the voltage generated between the electrodes of the second pair.

In measuring the leakage current or the dielectric breakdown voltage caused by hole migration, the voltage generated between the electrodes of the first pair when a prescribed magnitude of electric current flows through the first pair of electrodes is specified as the dielectric breakdown voltage caused by hole migration. In measuring the leakage current or the dielectric breakdown voltage caused by hole migration, the magnitude of the current that flows between the electrodes of the first pair when the voltage generated between the electrodes of the first pair has a prescribed magnitude is specified as the leakage current.

For example, the hole injection electrode used in the method injects a hole into a P-type Group 3-5 compound semiconductor, and the electron injection electrode injects an electron into an N-type Group 3-5 compound semiconductor. The semiconductor wafer measured by the above-described method can have, on the buffer layer, a multilayer semiconductor layer in which a field effect transistor is to be formed. In this case, the method further includes exposing at least a part of a surface of the buffer layer by removing at least a part of the multilayer semiconductor layer. And in providing the plurality of electrodes including the hole injection electrode, the plurality of electrodes including the hole injection electrode can be disposed on the exposed buffer layer.

When a semiconductor wafer including a multilayer semiconductor layer is measured by the above-described method, the method can further include providing, on the exposed buffer layer, a plurality of electrodes including an electron injection electrode made of a material that injects an electron into the buffer layer when an electric field is applied thereto; measuring an electric current flowing through a second pair of electrodes or a voltage generated between the electrodes of the second pair when a voltage or an electric current is applied to the second pair of electrodes, the second pair of electrodes being selected from the plurality of electrodes and including at least one electron injection electrode; and measuring a leakage current or a dielectric breakdown voltage caused by electron migration in the semiconductor wafer based on the current flowing through the second pair of electrodes or the voltage generated between the electrodes of the second pair.

In this case, in providing the plurality of electrodes including the hole injection electrode, the buffer layer can be heated after providing, on a surface of the buffer layer, a material containing an element or a compound containing, as a constituent, an atom that serves as an acceptor impurity in the buffer layer. Alternatively, in providing the plurality of electrodes that include the electron injection electrode, the buffer layer can be heated after providing, on a surface of the buffer layer, a material containing an element or a compound containing, as a constituent, an atom that serves as a donor impurity in the buffer layer. In the step of measuring electric current flowing through the first pair of electrodes or voltage between the first pair of electrodes, a direct-current voltage or a direct current can be applied between the first pair of electrodes. For example, the hole injection electrode comprises at least one of AuZn, AuNi, AuCr, Ti/Pt/Au and Ti/WSi.

According to the second aspect related to the present invention, provided is one exemplary method of measuring a leakage current or a dielectric breakdown voltage of a semiconductor wafer that has a base wafer, a buffer layer including an N-type Group 3-5 compound semiconductor provided on the base wafer, and a multilayer semiconductor layer provided on the buffer layer and in which a field effect transistor is to be formed. The method includes exposing at least a part of a surface of the buffer layer by removing at least a part of the multilayer semiconductor layer; providing, on the buffer layer, a plurality of electrodes that include an electron injection electrode made of a material that injects an electron into the N-type Group 3-5 compound semiconductor when an electric field is applied thereto; measuring an electric current flowing through a first pair of electrodes or a voltage generated between the electrodes of the first pair when a voltage or an electric current is applied to the first pair of electrodes, the first pair of electrodes being selected from the plurality of electrodes and including at least one electron injection electrode; and measuring a leakage current or a dielectric breakdown voltage caused by electron migration in the semiconductor wafer based on the current flowing through the electrodes of the first pair or the voltage generated between the first pair of electrodes.

MODE FOR CARRYING OUT THE INVENTION

Figure 1:
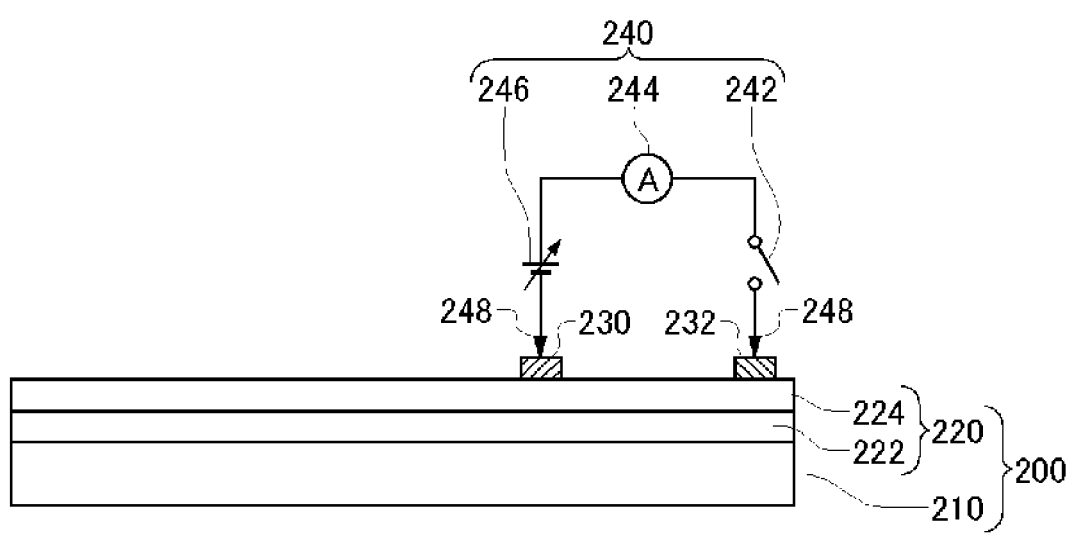
FIG. 1 illustrates an example of a measuring apparatus 240 and a semiconductor wafer 200.

FIG. 1 illustrates an example of a measuring apparatus 240 and a semiconductor wafer 200. The semiconductor wafer 200 includes a base wafer 210 and a buffer layer 220. The buffer layer 220 is a semiconductor that has been epitaxially grown on the base wafer 210. The buffer layer 220 includes, as an example, a lower buffer layer 222 and an upper buffer layer 224. On the buffer layer 220, a pair of electrodes, which are a hole injection electrode 230 and a hole collection electrode 232, is to be provided through a hereunder-described measuring method.

The measuring apparatus 240 has two measuring probes 248, a switch 242, an ammeter 244 and a direct-current voltage source. The measuring apparatus 240 measures a leakage current or a dielectric breakdown voltage of the semiconductor wafer 200 by bringing the two measuring probes 248 into contact with the hole injection electrode 230 or the hole collection electrode 232 respectively.

The hole injection electrode 230 contains a material that injects holes to the buffer layer 220 when an electric filed is applied thereto. The hole collection electrode 232 contains a material that collects holes from the buffer layer 220 when an electric filed is applied thereto. When the resistance of the buffer layer 220 is high, holes are injected into the buffer layer 220 by forcibly injecting holes to the buffer layer 220.

For example, when a voltage or a current is applied to the hole injection electrode 230 and the hole collection electrode 232, the buffer layer 220 is injected with holes from the hole injection electrode 230, and the holes are collected in the hole collection electrode 232 from the buffer layer 220. The leakage current or the dielectric breakdown voltage can be measured by injecting holes into the buffer layer 220 and measuring electric current or voltage between the hole injection electrode 230 and the hole collection electrode 232. An electrode other than the hole injection electrode 230 and the hole collection electrode 232 can be provided on the buffer layer 220.

In a case in which holes are injected into the buffer layer 220, an excessive current could flow like an avalanche when an excessive voltage is applied between the hole injection electrode 230 and the hole collection electrode 232. In this case, it is not possible to measure the leakage current or the dielectric breakdown voltage. In order to avoid this, a prescribed range of voltage is applied to the hole injection electrode 230 and the hole collection electrode 232.

Figure 2:
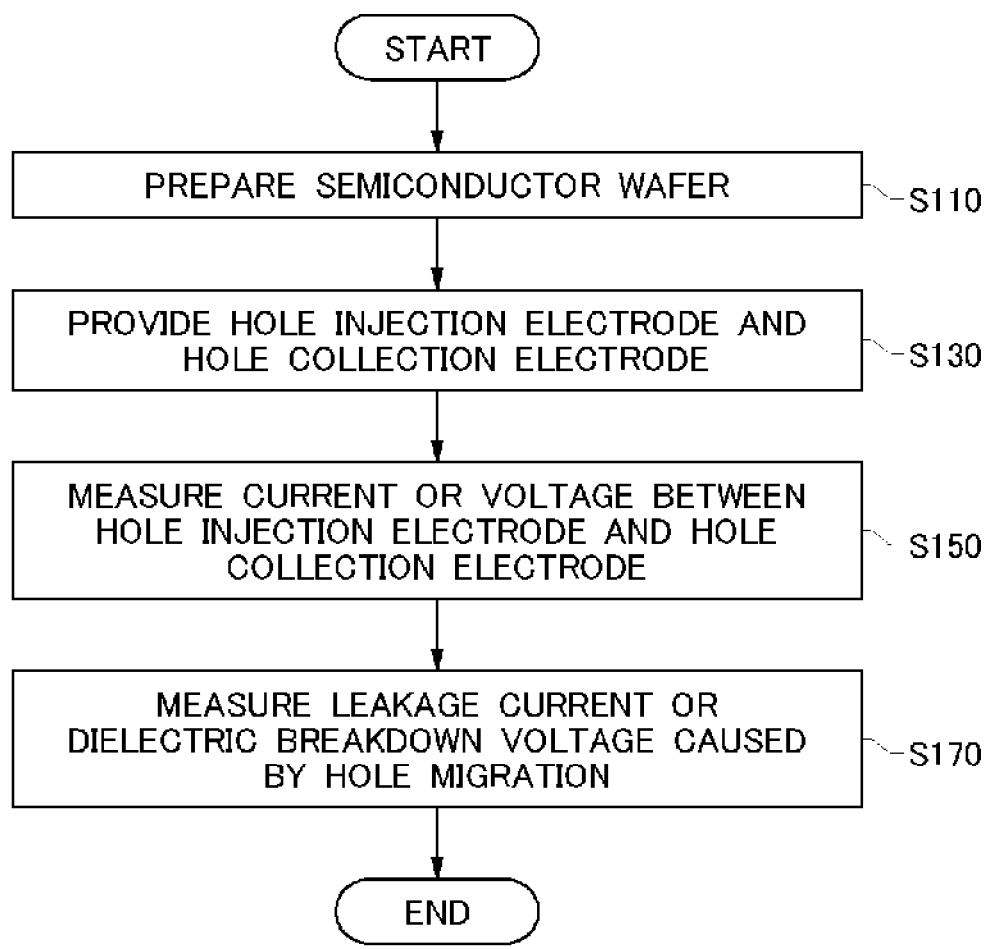
FIG. 2 is a flowchart showing a method of measuring a leakage current or a dielectric breakdown voltage of the semiconductor wafer 200.

FIG. 2 is a flowchart showing a method of measuring a leakage current or a dielectric breakdown voltage of the semiconductor wafer 200. This measuring method includes a step S110 of preparing the semiconductor wafer 200, a step S130 of providing the hole injection electrode 230 and the hole collection electrode 232 on the buffer layer 220, a step S150 of measuring an electric current flowing through the hole injection electrode 230 and the hole collection electrode 232 or a voltage generated between the hole injection electrode 230 and the hole collection electrode 232 when a voltage or an electric current is applied to the hole injection electrode 230 and the hole collection electrode 232, and a step S170 of measuring a leakage current or a dielectric breakdown voltage caused by hole migration in the semiconductor wafer 200 based on the measured current or voltage.

In the step S130 of providing the hole injection electrode 230 and the hole collection electrode 232, metal is deposited or patterned on the buffer layer 220 to form the hole injection electrode 230 and the hole collection electrode 232. In the step S130 of providing the hole injection electrode 230 and the hole collection electrode 232, any electrodes other than the hole injection electrode 230 and the hole collection electrode 232 can also be provided.

In the step S150 of measuring an electric current or a voltage, two measuring probes 248 of the measuring apparatus 240 are brought into contact with the hole injection electrode 230 and the hole collection electrode 232 respectively. Subsequently, a direct-current voltage is applied to the hole injection electrode 230 and the hole collection electrode 232, and values of the current flowing through the hole injection electrode 230 and the hole collection electrode 232 is measured while the direct-current voltage is applied thereto. More specifically, values of the current flowing through the hole injection electrode 230 and the hole collection electrode 232 are measured while changing the voltage applied between the hole injection electrode 230 and the hole collection electrode 232.

In the step S170 of measuring a leakage current or a dielectric breakdown voltage, for instance, a voltage generated between the hole injection electrode 230 and the hole collection electrode 232 when a prescribed magnitude of electric current flows through the hole injection electrode 230 and the hole collection electrode 232 is specified as the dielectric breakdown voltage caused by hole migration. Moreover, when the voltage generated between the hole injection electrode 230 and the hole collection electrode 232 has a prescribed magnitude, a magnitude of the current that flows between the hole injection electrode 230 and the hole collection electrode 232 can be specified as the leakage current.

When the measured value of the dielectric breakdown voltage is smaller than a prescribed voltage value, the semiconductor wafer 200 can be judged as defective. When the measured value of the leakage current is larger than a prescribed current value, the semiconductor wafer 200 can be judged as defective.

The base wafer 210 is a wafer that has a sufficient mechanical strength enough to hold other components formed on the base wafer 210. The base wafer is, for example, a compound semiconductor wafer made of such as GaAs, a Ge wafer, a germanium-on-insulator (GOI) wafer, a Si wafer or a silicon-on-insulator (SOI) wafer. The base wafer 210 is, for example, a single crystalline wafer. The base wafer 210 can be a sapphire wafer, a glass wafer or a resin wafer such as a PET film.

The buffer layer 220 is formed in contact with the base wafer 210 by, for example, an epitaxial growth method. The semiconductor wafer 200 can have other semiconductor layers between the base wafer 210 and the buffer layer 220. The buffer layer 220 can be composed of a single layer semiconductor layer or a multilayer semiconductor layer. For example, the buffer layer 220 is composed of a lower buffer layer 222 and an upper buffer layer 224 that have different compositions from each other.

The buffer layer 220 serves, for example, to prevent deterioration in characteristics of the semiconductor element formed on the base wafer 210 due to impurities left on the surface of the base wafer 210. The buffer layer 220 can suppress the leakage current from a semiconductor layer formed thereon. The buffer layer 220 can serve as a buffer layer that absorbs a difference in the lattice spacing between the semiconductor layer formed on the buffer layer and the base wafer 210. The buffer layer 220 can have a capability to secure the crystalline property of the semiconductor formed thereon. The buffer layer 220 can be, for example, a Group 3-5 compound semiconductor.

The buffer layer 220 can include a carrier trap. As an example of a carrier trap, a boron atom or an oxygen atom can be named. The buffer layer 220 is, for example, compound semiconductor $Al_xGa_{1-x}As$ ($0 \leq x \leq 1$) or $Al_yIn_zGa_{1-y-z}P$ ($0 \leq y \leq 1$, $0 \leq z \leq 1$, $0 \leq y+z \leq 1$) in which an oxygen atom is added as the carrier trap. By adding an oxygen atom to the compound semiconductor mentioned above, it is possible to generate a deep trap level in the compound semiconductor. Carriers that pass through the buffer layer 220 are trapped with the deep trap level. Consequently, it is possible to prevent a leakage current generated between other semiconductor layer formed on the buffer layer 220 and the base wafer 210 disposed under the buffer layer 220.

The resistivity of the buffer layer 220 that contains the carrier traps in its thickness direction is determined by the composition, a doping concentration of oxygen atoms and the film thickness. For example, when the buffer layer 220 is made of $Al_xGa_{1-x}As$ ($0 \leq x \leq 1$), the resistivity becomes higher as more Al is contained in the buffer layer as a constituting element. However, it is preferable that the Al composition be in a range where the crystalline quality is retained, and "x" is practically from about 0.3 to 0.5. It is also preferable that the doping concentration of oxygen atoms be higher as long as the crystalline quality is secured. Therefore, the oxygen atom concentration is preferably from $1 \times 10^{18}$ [$cm^{-3}$] to $1 \times 10^{20}$ [$cm^{-3}$]. Moreover, it is preferable that the film thickness of the buffer layer 220 be thicker as long as it will not cause any trouble in the growth time.

The buffer layer 220 can include more than one P-type Group 3-5 compound semiconductor. For example, among the Group 3-5 compound semiconductors, two adjacent Group 3-5 compound semiconductors form a heterojunction between $Al_xGa_{1-x}As$ ($0 \leq x \leq 1$) and $Al_yGa_{1-y}As$ ($0 \leq y \leq 1$, $x < y$), a heterojunction between $Al_pIn_qGa_{1-p-q}P$ ($0 \leq p \leq 1$, $0 \leq q \leq 1$) and $Al_rIn_sGa_{1-r-s}P$ ($0 \leq r \leq 1$, $0 \leq s \leq 1$, $p < r$, $0 \leq r+s \leq 1$), or a heterojunction between $Al_xGa_{1-x}As$ ($0 \leq x \leq 1$) and $Al_pIn_qGa_{1-p-q}P$ ($0 \leq p \leq 1$, $0 \leq q \leq 1$, $0 \leq p+q \leq 1$).

For example, when the lower buffer layer 222 included in the buffer layer 220 is a P-type semiconductor layer $Al_xGa_{1-x}As$ ($0 \leq x \leq 1$) and the upper buffer layer 224 included in the buffer layer 220 is a P-type semiconductor layer $Al_yGa_{1-y}As$ ($0 \leq y \leq 1$), and when $x > y$, the P-type semiconductor layer $Al_xGa_{1-x}As$ has a higher Al composition than the P-type semiconductor layer $Al_yGa_{1-y}As$. As a result, the buffer layer 220 has an energy band gap which is wide enough to reduce the carrier migration between the upper surface and the lower surface of the buffer layer 220. When the buffer layer 220 has a wide band gap, the buffer layer 220 serves as an energy barrier that inhibits the carrier migration from the upper buffer layer 224 to the lower buffer layer 222, and therefore generation of the leakage current is suppressed.

The buffer layer 220 can include more than one P-type semiconductor layer. P-type semiconductor layers can each have a thickness in the scale of atom, and the buffer layer 220 as a whole can form a superlattice. In such case, a plurality of energy barriers are formed by a plurality of hetrojunctions, and the leakage current can be more effectively prevented.

The buffer layer 220 can include a P-type semiconductor layer and an N-type semiconductor layer that form a PN junction. For instance, when the upper buffer layer 224 is a P-type semiconductor layer and the lower buffer layer 222 is an N-type semiconductor layer, a depletion region is formed at the PN junction and therefore the buffer layer 220 inhibits the carrier migration. The buffer layer 220 can include more than one P-type semiconductor layer and more than one N-type semiconductor layer, and the P-type semiconductor layers and the N-type semiconductor layers can be alternatively deposited to form a plurality of PN junctions. The plurality of PN junctions form a plurality of depletion regions that inhibit the carrier migration so that it is possible to prevent the leakage current effectively.

The hole injection electrode 230 is formed of a material that injects a hole into a P-type Group 3-5 compound semiconductor when an electric field is applied. More than one hole injection electrode 230 can be formed in contact with the buffer layer 220. The hole injection electrode 230 can be formed of, for example, AuZn, AuNi, AuCr, Ti/Pt/Au or Ti/WSi.

When a current or voltage is measured using the measuring apparatus 240, the two measuring probes are made in contact with the hole injection electrode 230 and the hole collection electrode 232 respectively, and a voltage from a direct-current voltage source 246 is applied to the hole injection electrode 230 and the hole collection electrode 232. The ammeter 244 is used for measuring a current value at the time when the voltage is applied. As changing the voltage output by the direct-current voltage source 246, current values in response to the changed voltages are measured.

The semiconductor wafer 200 can be formed by the following production method. When the base wafer 210 is a GaAs single crystalline wafer, the buffer layer 220 made of AlGaAs is epitaxially grown on the base wafer. An example of the epitaxial growth method includes a metal organic chemical vapor deposition method (hereunder also referred to as a MOCVD method) and a molecular beam epitaxy method (hereunder also referred to as a MBE method).

In order to epitaxially grow the buffer layer 220 using a MOCVD method, a surface of the GaAs single crystalline base wafer 210 is degreased, etched, water-washed and dried, and then the base wafer 102 is placed on a heating table of a reduced-pressure barrel-type MOCVD reactor. After the atmosphere inside the reactor is sufficiently replaced by high-purity hydrogen, heating of the base wafer 210 is started. A wafer temperature at the time of crystal growth can be, for example, any temperature between 500° C. to 800° C. When the temperature of the base wafer 210 is settled to an adequate temperature, an arsenic source is introduced into the reactor, and then a gallium source or an aluminum source is subsequently introduced to form an AlGaAs layer by the epitaxial growth method.

As a Group 3 element source, it is possible to use trimethyl gallium (TMG), trimethyl aluminium (TMA) or the like. As a Group 5 element source gas, it is possible to use arsine ($AsH_3$) or the like. Conditions for the epitaxial growth are, for example, a pressure inside the reactor of 0.1 atm, a growth temperature of 650° C. and a growth rate of 1 to 3 μm/hr. A carrier gas used as the source is, for example, high-purity hydrogen.

Oxygen atoms can be added into the buffer layer 220 as carrier traps. Oxygen atoms can be added by introducing a mixture of a diluted oxygen gas and a hydrogen gas or an inactive gas into the reactor during the epitaxial growth of the buffer layer 220. Oxygen atoms can also be added into the buffer layer 220 utilizing an oxygen compound contained in an organometallic material. Alternatively, by separately adding an ether based material as an oxygen compound, oxygen atoms can be added. By adding oxygen atoms into the buffer layer 220, a deep trap level which inhibits carriers from passing through the layer can be generated, and consequently the electric resistance of the buffer layer 220 is increased, and therefore the leakage current can be prevented.

The buffer layer 220 can be formed, on the base wafer 210, by epitaxially growing the lower buffer layer 222 and the upper buffer layer 224 sequentially, and these two layers contain AlGaAs with different Al composition from each other. By adding more Al to the lower buffer layer 222 than the upper buffer layer 224, it is possible for the buffer layer 220 to have a wider energy band gap. Consequently, carriers are inhibited from migrating toward the base wafer 210 by the resulting energy barrier, and therefore the generation of the leakage current can be suppressed. The amount of Al added to the layer can be controlled by adjusting the flow rate of trimethyl alminium (TMA).

In the step S130 of providing the hole injection electrode 230 and the hole collection electrode 232, the hole injection electrode 230 and the hole collection electrode 232 are formed such that they are in contact with the upper buffer layer 224. As a method of forming the electrode, there are sputtering, chemical vapor deposition (also referred to as CVD) methods and the like. For example, a resist mask that has an opening at a position where the hole injection electrode 230 is to be formed is formed by a photolithography method. Subsequently, AuZn is deposited by a sputtering method, and then the resist mask is lifted off to form the hole injection electrode 230.

The hole injection electrode 230 and the hole collection electrode 232 are, for example, rectangular electrodes having a length of 0.2 mm and a width of 0.1 mm, which are provided with a pitch (a distance between two adjacent electrodes) of 5 μm. The hole injection electrode 230 and the hole collection electrode 232 can be a circular electrode with a diameter of 0.06 mm and an annular electrode which encompasses the circular electrode at a distance of about 5 μml from the outer circumference of the circular electrode respectively.

The step S130 of providing the hole injection electrode 230 and the hole collection electrode 232 can include a step of providing, on the upper buffer layer 224, a material containing an element which serves as an acceptor impurity in the P-type 3-5 compound semiconductor, and subsequently heating the wafer. For example, after Zn, Mg or Be which serves as an acceptor impurity in the P-type 3-5 compound semiconductor is ion-implanted to a part of the surface of the upper buffer layer 224 on which the hole injection electrode 230 is to be formed, the hole injection electrode 230 is formed and the wafer is heated. Since heating is performed after the ion implantation, the material of the hole injection electrode 230 is diffused into the upper buffer layer 224, and therefore the resistance between the hole injection electrode 230 and the upper buffer layer 224 becomes small.

In the step S150 of measuring an electric current or a voltage, two measuring probes 248 of the measuring apparatus 240 are brought into contact with the hole injection electrode 230 and the hole collection electrode 232 respectively. Subsequently, values of the current are measured by the ammeter 244 while the voltage applied by the direct-current voltage source 246 is changed. By measuring current values as the voltage applied from the direct-current voltage source 246 is varied, a current-voltage characteristic caused by hole migration between the two electrodes can be measured. As an example of measuring condition, the voltage to be applied can be increased with a step of 0.1 kV/cm in an electric field range of 0 to 0.1 MV/cm, and a current value can be measured at each step.

Figure 3:
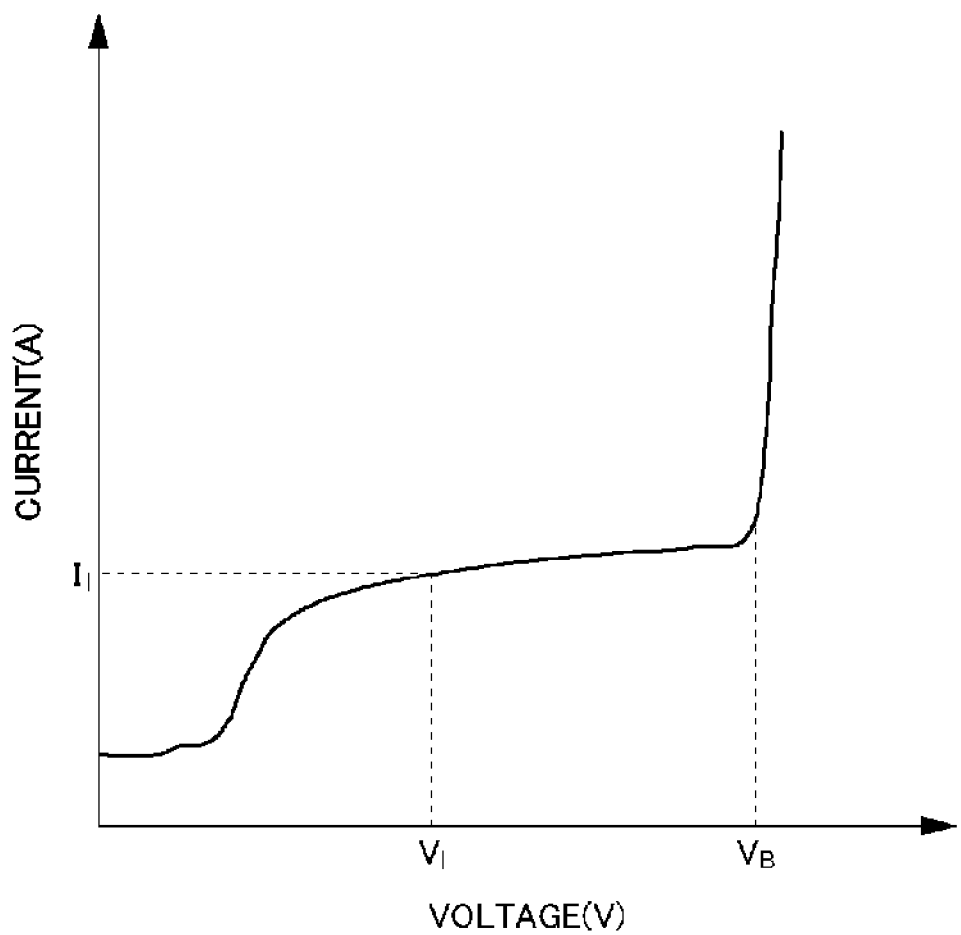
FIG. 3 illustrates an example of a voltage-current characteristic that is obtained by measuring an electric current and voltage of the semiconductor wafer 200.

FIG. 3 illustrates an example of the current-voltage characteristic obtained by measuring the current or voltage. When the applied voltage is increased, the current is also increased. Therefore, a current value for a voltage V1 can be specified as a leakage current I1. For example, a current value that is obtained when a voltage of 10.0 (V) is applied can be specified as a magnitude of the leakage current. The quality of the semiconductor wafer 200 can be evaluated by judging the semiconductor wafer 200 as non-defective when the leakage current I1 is less than a prescribed value and judging the semiconductor wafer 200 as defective when the leakage current I1 is equal to or more than the prescribed value.

When the voltage is further increased the current surges at some point. The voltage at which the current starts to surge can be specified as a dielectric breakdown voltage VB. For example, the voltage at which the current becomes $1.0 \times 10^{-5}$ (A) can be defined as the dielectric breakdown voltage. The quality of the semiconductor wafer 200 can be evaluated by judging the semiconductor wafer 200 as non-defective when the dielectric breakdown voltage VB is equal to or above a prescribed value and judging the semiconductor wafer 200 as defective when the dielectric breakdown voltage VB is less than the prescribed value.

Figure 4:
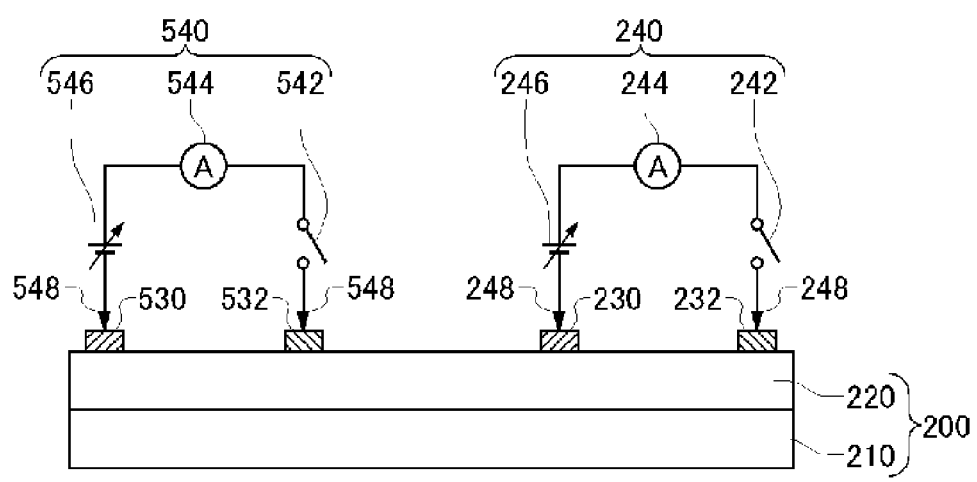
FIG. 4 illustrates an example of the semiconductor wafer 200, a measuring apparatus 240 and a measuring apparatus 540.

FIG. 4 illustrates an example of the semiconductor wafer 200, the measuring apparatus 240 and a measuring apparatus 540. According to the embodiment shown in FIG. 4, a pair of electrodes including an electron injection electrode 530 and an electron collection electrode 532 is further provided on the semiconductor substrate 200, in addition to the configuration shown in FIG. 1. By providing the hole injection electrode 230 that injects holes into the buffer layer 220, the hole collection electrode 232, the electron injection electrode 530 that injects electrons into the buffer layer 220 and the electron collection electrode 532 in the same semiconductor wafer 200, it is possible to measure a current-voltage characteristic caused by hole migration and a current-voltage characteristic caused by electron migration at the same time.

The electron injection electrode 530 contains a material that injects an electron into the buffer layer 220 when an electric field is applied thereto. The electron collection electrode 532 contains a material that collects an electron from the buffer layer 220 when an electric field is applied thereto. The electron injection electrode 530 contains a material that injects an electron into an N-type Group 3-5 compound semiconductor. More than one electron injection electrode 530 and the electron collection electrode 532 can be formed such that they are in contact with the buffer layer 220. An example of the electron injection electrode 530 and the electron collection electrode 532 can include AuGe/Ni/Au electrodes.

The measuring apparatus 540 includes a switch 542, an ammeter 544, a direct-current voltage source 546, and a pair of measuring probes 548. When a measurement of a current-voltage characteristic is carried out, the measuring probes 548 are brought into contact with the electron injection electrode 530 and the electron collection electrode 532, and a voltage from the direct-current voltage source 546 is applied between the electron injection electrode 530 and the electron collection electrode 532. Currents are measured with the ammeter 544 while the voltage to be applied is changed, and the current-voltage characteristic caused by electron migration is measured.

Figure 5:
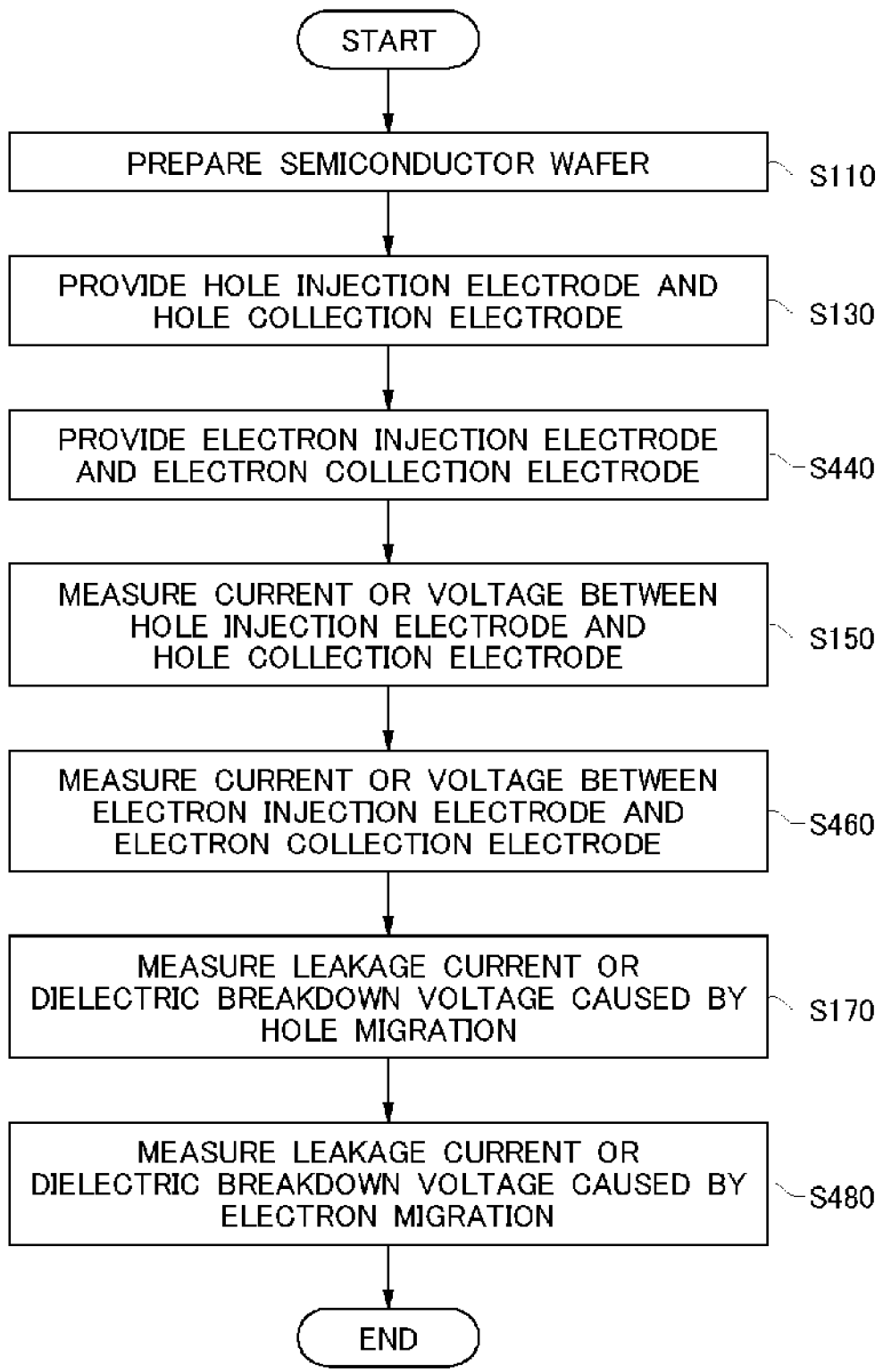
FIG. 5 is a flowchart showing a method of measuring a leakage current and a dielectric breakdown voltage of the semiconductor wafer 200.

FIG. 5 is a flowchart showing a method of measuring a leakage current and a dielectric breakdown voltage of the semiconductor wafer 200 shown in FIG. 4. According to this embodiment, the measuring method includes a step S440 of providing, on the buffer layer 220, the electron collection electrode 532 and the electron injection electrode 530 that is made of a material that injects an electron into the buffer layer 220 when an electric field is applied, a step S460 of measuring a current flowing through the electron injection electrode 530 and the electron collection electrode 532 or a voltage generated between the electron injection electrode 530 and the electron collection electrode 532 when a voltage or current is applied between the electron injection electrode 530 and the electron collection electrode 532, and a step S480 of measuring a leakage current or a dielectric breakdown voltage caused by electron migration in the semiconductor wafer 200 based on the measured current or voltage, in addition to the steps in the embodiment described with reference to FIG. 2.

In the step S440 of providing the electron injection electrode 530 and the electron collection electrode 532, a material containing an element that serves as a donor impurity in an N-type Group 3-5 compound semiconductor is disposed on the surface of the buffer layer 220, and then the semiconductor wafer 200 is heated. For example, Si which serves as a donor impurity in the N-type Group 3-5 compound semiconductor is ion-implanted into parts of the surface of the buffer layer 220 where the electron injection electrode 530 and the electron collection electrode 532 are to be formed. Subsequently, the electron injection electrode 530 and the electron collection electrode 532 are formed and then the semiconductor wafer 200 is heated. By heating the wafer after the ion-implantation, it is possible to reduce the resistance between the buffer layer 220, and the electron injection electrode 530 and the electron collection electrode 532. Although this step S440 is performed after the step S130 in the flowchart shown in FIG. 5, the step S440 can be performed before the step S130 or can be performed simultaneously with the step S130.

In the step S460 of measuring a current flowing through the electron injection electrode 530 and the electron collection electrode 532 or a voltage generated between the electron injection electrode 530 and the electron collection electrode 532, the two measuring probes 548 of the measuring apparatus 540 are brought into contact with more than one electron injection electrode 530 and electron collection electrode 532 that have been formed. Subsequently, current is measured using the ammeter 544 as the voltage applied from the direct-current voltage source 546 is changed.

By measuring current values while varying the voltage applied from the direct-current voltage source 546, it is possible to measure a current-voltage characteristic caused by electron migration between the two electrodes. As an example of measuring condition, the voltage to be applied can be increased with a step of 0.1 kV/cm in an electric field range of 0 to 0.1 MV/cm, and a current value can be measured at each step. Although the measurement step S460 is performed after the measurement step S150 in the flowchart shown in FIG. 5, the measurement step S460 can be performed before the step S150 or can be performed simultaneously with the measurement step S150.

In the step S480 of measuring a leakage current or a dielectric breakdown voltage caused by electron migration, based on the current-voltage characteristic obtained in the step S460 of measuring the current or the voltage, a leakage current or a dielectric breakdown voltage caused by electron migration in the semiconductor wafer 200 is measured. Although the step S480 is performed after the step S170 in the flowchart shown in FIG. 5, the step S480 can be performed before the step S170 or can be performed simultaneously with the step S170.

In the step S480 of measuring a leakage current or dielectric breakdown voltage caused by electron migration, the breakdown strength of the semiconductor wafer 200 can be determined by a value of VB in the same manner as the current-voltage characteristic caused by hole is measured, which was illustrated in FIG. 3. Moreover, the leakage current of the semiconductor wafer 200 can be determined by the magnitude of the leakage current I1 at a constant voltage V1. The quality of the semiconductor wafer 200 can be evaluated by judging the semiconductor wafer 200 as non-defective when the leakage current l1 is less than a prescribed value and judging the semiconductor wafer 200 as defective when the leakage current l1 is equal to or more than the prescribed value.

Figure 6:
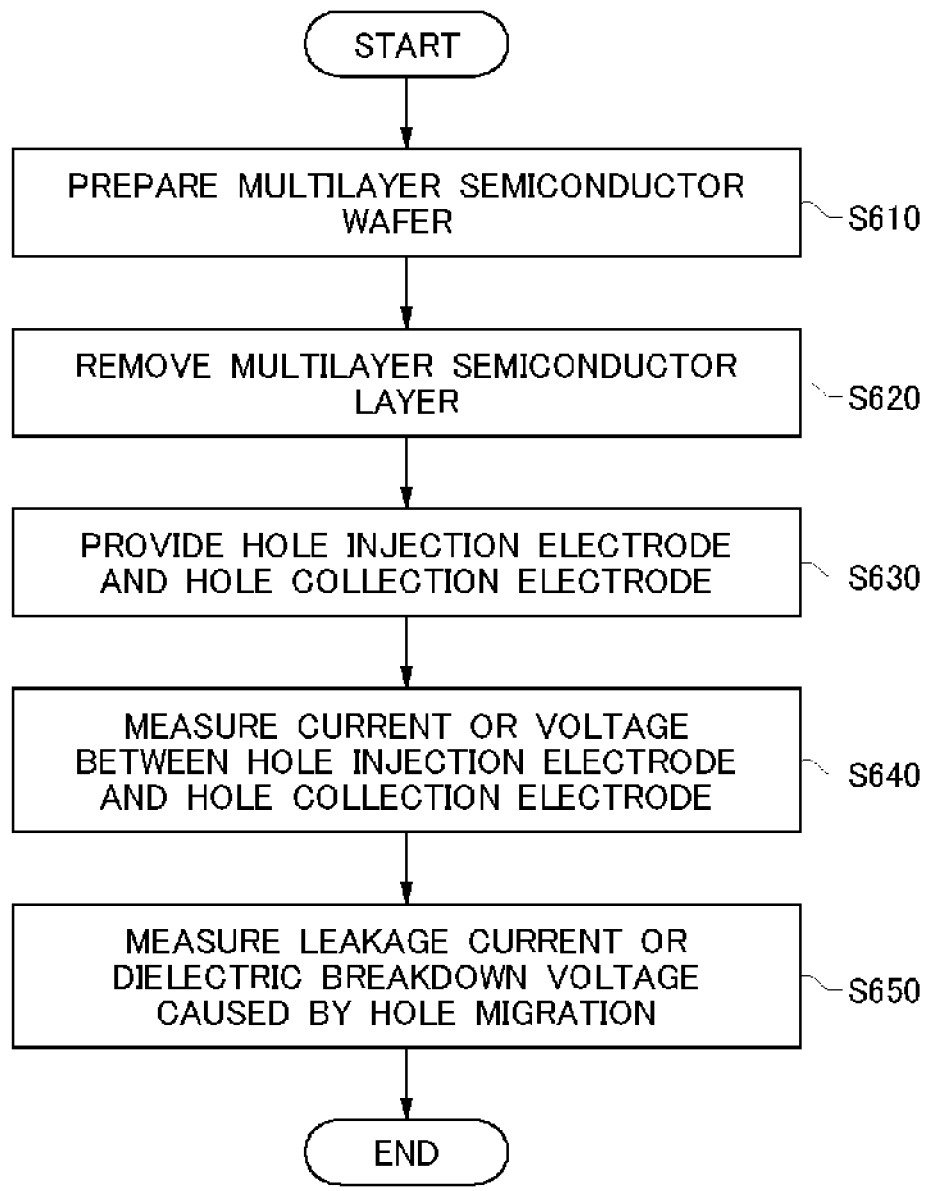
FIG. 6 is a flowchart showing a method of measuring a leakage current and a dielectric breakdown voltage of a multilayer semiconductor wafer 700.
Figure 7:
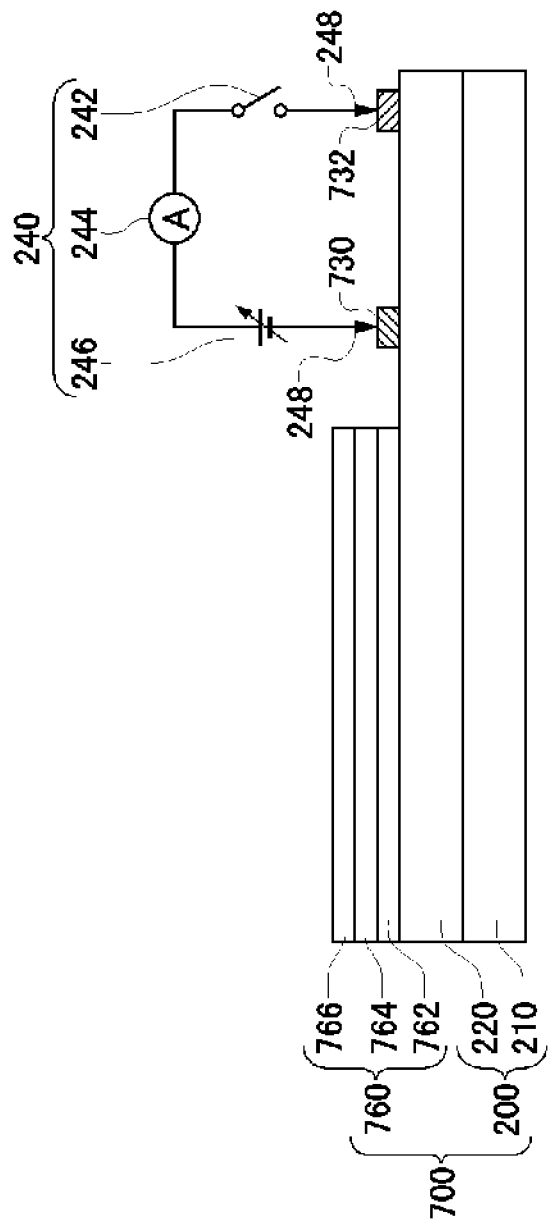
FIG. 7 illustrates an example of the multilayer semiconductor wafer 700 and the measuring apparatus 240.

FIG. 6 is a flowchart showing a method of measuring a leakage current and a dielectric breakdown voltage of a multilayer semiconductor wafer 700. FIG. 7 illustrates an example of the multilayer semiconductor wafer 700 and the measuring apparatus 240. In this embodiment, a leakage current or a dielectric breakdown voltage of the multilayer semiconductor wafer 700 in which a multilayer semiconductor layer 760 is formed on the semiconductor wafer 200 is measured. The multilayer semiconductor wafer 700 includes the base wafer 210, the buffer layer 220 and the multilayer semiconductor layer 760 in the stated order.

The multilayer semiconductor layer 760 includes a semiconductor layer 762, a semiconductor layer 764 and a semiconductor layer 766. The multilayer semiconductor layer 760 is a multilayer semiconductor layer from which a field effect transistor (also referred to as an FET) can be fabricated. For example, the multilayer semiconductor layer 760 is a multilayer semiconductor layer from which a high electron mobility transistor (also referred to as a HEMT) which is one of the FET can be fabricated. The semiconductor layer 764 is a channel layer that forms a carrier channel when it is reacted with a two-dimensional gas. The semiconductor layer 762 and the semiconductor layer 766 is a carrier supply layer that supplies a carrier to the semiconductor layer 764.

The structure of the multilayer semiconductor layer 760 is not limited to the three-layered structure shown in FIG. 7 but can be a two or more layered structure. Each layer in the multilayer semiconductor layer 760 is sequentially formed on the semiconductor wafer 200 by an epitaxial growth method. An example of the epitaxial growth method includes an MOCVD method and an MBE method.

As shown in FIG. 6, a measuring method according to this embodiment includes a step S610 of preparing the multilayer semiconductor wafer 700, a step S620 of removing the multilayer semiconductor layer 760, a step S630 of providing a hole injection electrode 730 and a hole collection electrode 732, a step S640 of measuring a current-voltage characteristic between the hole injection electrode 730 and the hole collection electrode 732, and a step S650 of measuring a leakage current and a dielectric breakdown voltage caused by hole migration. The measuring method according to the embodiment will be now described with reference to the example shown in FIG. 7. Explanations for the same features and structures as those of the embodiment described above with reference to FIG. 1 would not be hereunder repeated.

In the step S610 of preparing the multilayer semiconductor wafer 700, the multilayer semiconductor wafer 700 is prepared. The multilayer semiconductor wafer 700 is, for example, a multilayer semiconductor wafer on which the multilayer semiconductor layer 760 has been already formed on the semiconductor wafer 200.

In the step S620 of removing the multilayer semiconductor layer 760, at least a part of multilayer semiconductor layer 760 in the multilayer semiconductor wafer 700 is removed by etching or the like to expose at least a part of the surface of the buffer layer 220. It is preferable that the whole of the multilayer semiconductor layer 760 be removed to expose the whole surface of the buffer layer 220.

When a part of the multilayer semiconductor layer 760 is removed, a resist mask that has an opening at a position where the multilayer semiconductor layer 760 to be removed is formed on the surface of the multilayer semiconductor layer 760. Subsequently, etching using phosphoric acid or the like is performed to remove the multilayer semiconductor layer 760 in the opening of the mask, and the corresponding surface of the buffer layer is exposed. FIG. 7 illustrates the case in which a part of the multilayer semiconductor layer 760 on the right side of the multilayer semiconductor wafer 700 has been removed.

In the step S630 of providing the hole injection electrode 730 and the hole collection electrode 732, the hole injection electrode 730 and the hole collection electrode 732 are formed in contact with the exposed buffer layer 220. The hole injection electrode 730 contains a material that injects holes to the buffer layer 220 when an electric filed is applied thereto. The hole collection electrode 732 contains a material that collects holes from the buffer layer 220 when an electric filed is applied thereto. A method of forming the hole injection electrode 730 and the hole collection electrode 732 can be identical to the method of forming the hole injection electrode 230 and the hole collection electrode 232. By the same method as one illustrated in FIG. 2 using the hole injection electrode 730 and the hole collection electrode 732, it is possible to measure a leakage current or a dielectric breakdown voltage caused by migration in the multilayer semiconductor wafer 700.

Figure 8:
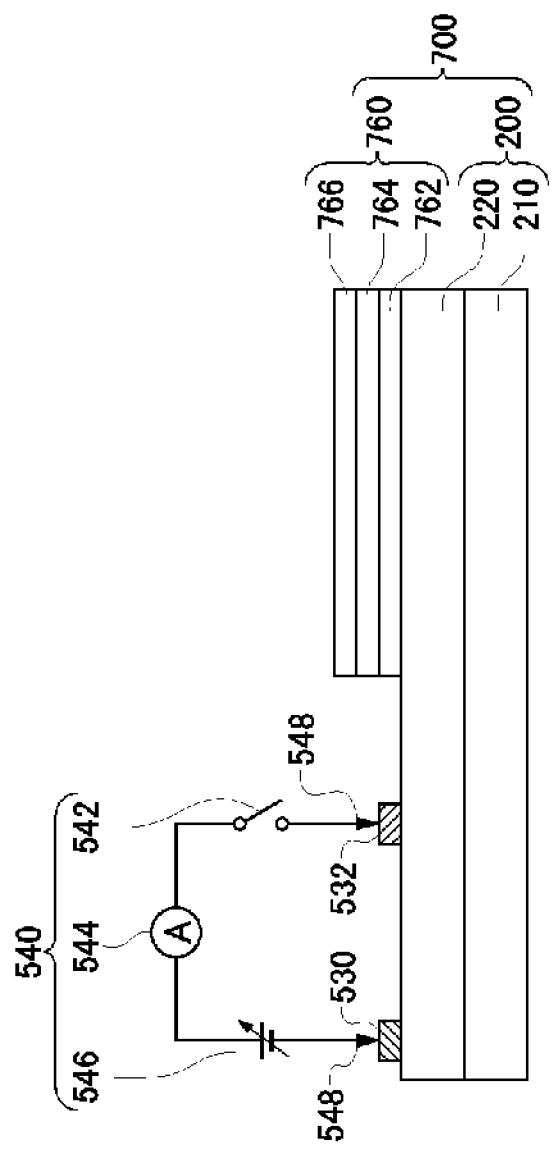
FIG. 8 illustrates an example of the multilayer semiconductor wafer 700 and the measuring apparatus 540.

FIG. 8 illustrates an example of the multilayer semiconductor wafer 700 and the measuring apparatus 540. In this embodiment, a part of the multilayer semiconductor layer 760 in the multilayer semiconductor wafer 700 is removed, and the electron injection electrode 530 and the electron collection electrode 532 are formed on the exposed surface of the buffer layer 220. After the formation, a current-voltage characteristic caused by electron migration between the electron injection electrode 530 and the electron collection electrode 532 is measured using the measuring apparatus 540.

In this measuring method, the step S610 of preparing the multilayer semiconductor wafer 700 shown in FIG. 6, the step S620 of removing the multilayer semiconductor layer 760, the step S440 of providing more than one electron injection electrode 530 and electron collection electrode 532, the step S460 of measuring a current or a voltage generated between the electron injection electrode 530 and the electron collection electrode 532, and the step S480 of measuring a leakage current or a dielectric breakdown voltage caused by electron migration are performed.

In the step S620 of removing the multilayer semiconductor layer 760, a part of the multilayer semiconductor layer 760 is removed to expose a part of the surface of the buffer layer 220. In the step S440 of providing more than one electron injection electrode 530 and electron collection electrode 532 shown in FIG. 5, the electron injection electrode 530 and the electron collection electrode 532 are formed such that they are in contact with the exposed buffer layer 220.

In the step S460 of measuring a current or a voltage generated between the electron injection electrode 530 and the electron collection electrode 532, a current-voltage characteristic between the electron injection electrode 530 and the electron collection electrode 532 is measured. Finally, in the step S480 of measuring a leakage current or a dielectric breakdown voltage caused by electron migration, a leakage current or a dielectric breakdown voltage caused by electron migration in the multilayer semiconductor wafer 700 is measured based on the measured current-voltage characteristic.

Figure 9:
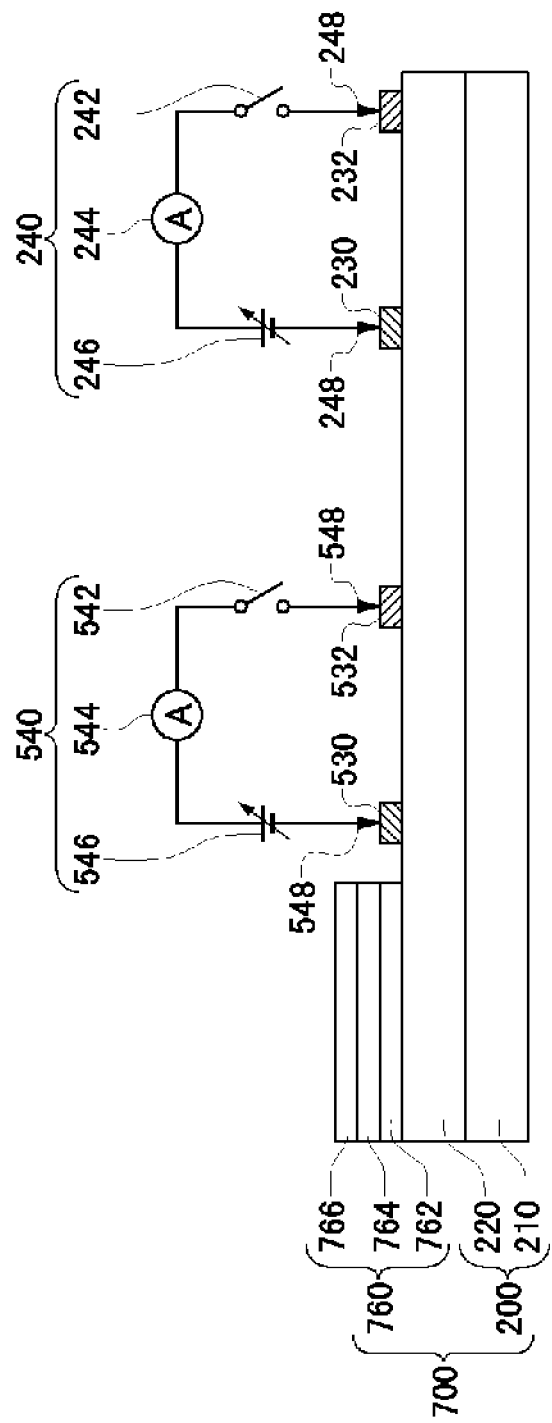
FIG. 9 illustrates an example of the multilayer semiconductor wafer 700, the measuring apparatus 240 and the measuring apparatus 540.

FIG. 9 illustrates an example of the multilayer semiconductor wafer 700, the measuring apparatus 240 and the measuring apparatus 540. In this embodiment, the hole injection electrode 230, the hole collection electrode 232, the electron injection electrode 530 and the electron collection electrode 532 are provided on the surface of the buffer layer 220 which is exposed by removing a part of the multilayer semiconductor layer 760 in the multilayer semiconductor wafer 700. A leakage current or a dielectric breakdown voltage of the multilayer semiconductor wafer 700 is measured using these electrodes.

By providing the hole injection electrode 230, the hole collection electrode 232, the electron injection electrode 530 and the electron collection electrode 532 in the same multilayer semiconductor wafer 700, it is possible to measure both a current-voltage characteristic caused by hole migration and a current-voltage characteristic caused by electron migration at the same time.

In the above-described embodiments, a two-terminal measuring method in which two measuring probes are brought into contact with a pair of electrodes was described as the measuring method for the current-voltage characteristic. However, a four-terminal measuring method can be adopted as the measuring method for the current-voltage characteristic. An example of the four-terminal measuring method includes a linearly-arranged four-terminal measuring method and a Van Der Pauw method.

Figure 10:
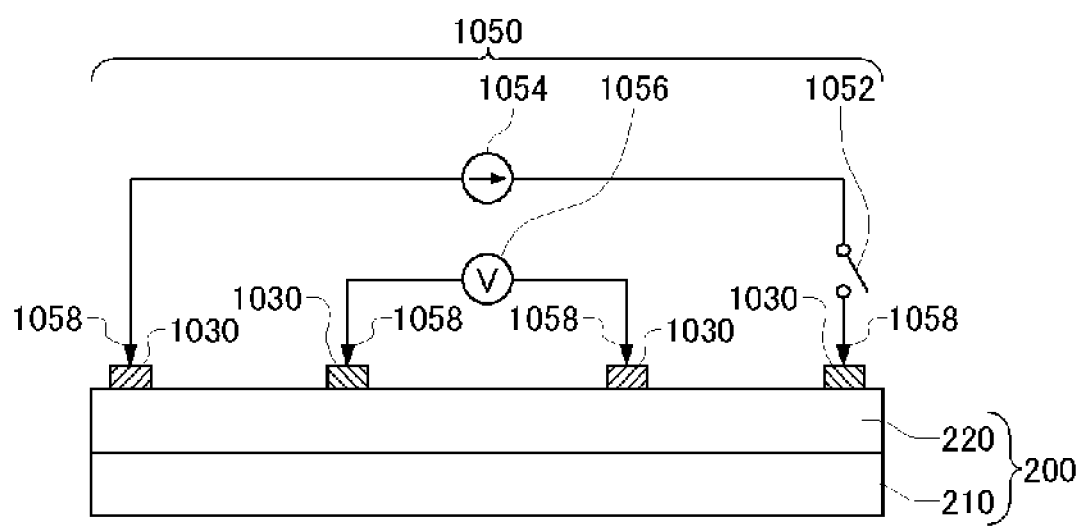
FIG. 10 illustrates an example of the semiconductor wafer 200 and a measuring apparatus 1050.

FIG. 10 illustrates an example of the semiconductor wafer 200 and a measuring apparatus 1050. A measuring apparatus 1050 can measure a leakage current or a dielectric breakdown voltage of the semiconductor wafer 200 by a four-terminal measuring method. In the configuration shown in FIG. 10, four electrodes 1030 are provided on the surface of the buffer layer 220 on the semiconductor wafer 200, and a leakage current of the semiconductor wafer 200 is measured with the measuring apparatus 1050. The measuring apparatus 1050 includes a switch 1052, a direct-current source 1054, a voltmeter 1056 and four measuring probes 1058.

When a leakage current or a dielectric breakdown voltage caused by hole migration is measured, the electrode 1030 serves as the hole injection electrode. When a leakage current or a dielectric breakdown voltage caused by electron migration is measured, the electrode 1030 serves as the electron injection electrode. As an example of the measuring method, a certain current is applied between the two electrodes 1030 situated on the outer side by the direct-current source 1054, and a voltage generated between the two electrodes 1030 situated on the inner side is measured with the voltmeter 1056. Based on the result obtained by the measurement, an electric resistance between the two inner side electrodes 1030 can be determined. Consequently, based on the measured electric resistance value, it is possible to evaluate the leakage current of the semiconductor wafer 200.

The two-terminal measuring method in the above-described embodiments can be replaced by the four-terminal measuring method. Moreover, in the embodiments described above, electrodes for the two-terminal measurement and electrodes for the four-terminal measurement can be both formed on the semiconductor wafer 200 or the multilayer semiconductor wafer 700, and the two-terminal measurement and the four-terminal measurement can be simultaneously performed. Alternatively, electrodes that can be used for both of the two-terminal measurement and the four-terminal measurement can be provided.

When the electric characteristics of the semiconductor wafer 200 or the multilayer semiconductor wafer 700 is measured by the two-terminal measuring method and the four-terminal measuring method, a current-voltage characteristic caused by hole migration can be measured at each of the two-terminal measurement and the four-terminal measurement. Moreover, a current-voltage characteristic caused by electron migration can be measured at each of the two-terminal measurement and the four-terminal measurement. Alternatively, a current-voltage characteristic caused by hole migration can be measured at one of the two-terminal measurement and the four-terminal measurement, and a current-voltage characteristic caused by electron migration can be measured at the other of the two-terminal measurement and the four-terminal measurement.

The invention claimed is:

1. A method of measuring a leakage current or a dielectric breakdown voltage of a semiconductor wafer that has a base wafer and a buffer layer formed on the base wafer, the method comprising:
providing, on the buffer layer, a plurality of electrodes including a hole injection electrode made of a material that injects a hole into the buffer layer when an electric field is applied thereto;
measuring an electric current flowing through a first pair of electrodes or a voltage generated between the electrodes of the first pair when a voltage or an electric current is applied to the first pair of electrodes, the first pair of electrodes being selected from the plurality of electrodes and including at least one hole injection electrode; and
measuring a leakage current or a dielectric breakdown voltage caused by hole migration in the semiconductor wafer based on the current flowing through the first pair of electrodes or the voltage generated between the electrodes of the first pair.

2. The method according to claim 1, further comprising:
providing, on the buffer layer, a plurality of electrodes including an electron injection electrode made of a material that injects an electron into the buffer layer when an electric field is applied thereto;
measuring an electric current flowing through a second pair of electrodes or a voltage generated between the electrodes of the second pair when a voltage or an electric current is applied to the second pair of electrodes, the second pair of electrodes being selected from the plurality of electrodes and including at least one electron injection electrode; and
measuring a leakage current or a dielectric breakdown voltage caused by electron migration in the semiconductor wafer based on the current flowing through the second pair of electrodes or the voltage generated between the electrodes of the second pair.

3. The method according to claim 1, wherein
in measuring the leakage current or the dielectric breakdown voltage caused by hole migration, the voltage generated between the electrodes of the first pair when a prescribed magnitude of electric current flows through the first pair of electrodes is specified as the dielectric breakdown voltage caused by hole migration.

4. The method according to claim 1, wherein
in measuring the leakage current or the dielectric breakdown voltage caused by hole migration, the magnitude of the current that flows between the electrodes of the first pair when the voltage generated between the electrodes of the first pair has a prescribed magnitude is specified as the leakage current.

5. The method according to claim 2, wherein
the hole injection electrode injects a hole into a P-type Group 3-5 compound semiconductor, and the electron injection electrode injects an electron into an N-type Group 3-5 compound semiconductor.

6. The method according to claim 1, wherein
the semiconductor wafer has, on the buffer layer, a multilayer semiconductor layer in which a field effect transistor is to be formed.

7. The method according to claim 6, further comprising:
exposing at least a part of a surface of the buffer layer by removing at least a part of the multilayer semiconductor layer, wherein
in providing the plurality of electrodes including the hole injection electrode, the plurality of electrodes including the hole injection electrode are disposed on the exposed buffer layer.

8. The method according to claim 7, further comprising:
providing, on the exposed buffer layer, a plurality of electrodes including an electron injection electrode made of a material that injects an electron into the buffer layer when an electric field is applied thereto;
measuring an electric current flowing through a second pair of electrodes or a voltage generated between the electrodes of the second pair when a voltage or an electric current is applied to the second pair of electrodes, the second pair of electrodes being selected from the plurality of electrodes and including at least one electron injection electrode; and measuring a leakage current or a dielectric breakdown voltage caused by electron migration in the semiconductor wafer based on the current flowing through the second pair of electrodes or the voltage generated between the electrodes of the second pair.

9. The method according to claim 1, wherein in providing the plurality of electrodes including the hole injection electrode, the buffer layer is heated after providing, on a surface of the buffer layer, a material containing an element or a compound containing, as a constituent, an atom that serves as an acceptor impurity in the buffer layer.

10. The method according to claim 2, wherein in providing the plurality of electrodes that include the electron injection electrode, the buffer layer is heated after providing, on a surface of the buffer layer, a material containing an element or a compound containing, as a constituent, an atom that serves as a donor impurity in the buffer layer.

11. The method according to claim 1, wherein in measuring the electric current flowing through the first pair of electrodes or the voltage generated between the electrodes of the first pair, a direct-current voltage or a direct current is applied to between the electrodes of the first pair.

12. The method according to claim 1, wherein the hole injection electrode comprises at least one of AuZn, AuNi, AuCr, Ti/Pt/Au and Ti/WSi.

13. A method of measuring a leakage current or a dielectric breakdown voltage of a semiconductor wafer that has a base wafer, a buffer layer including an N-type Group 3-5 compound semiconductor provided on the base wafer, and a multilayer semiconductor layer provided on the buffer layer and in which a field effect transistor is to be formed, the method comprising:

exposing at least a part of a surface of the buffer layer by removing at least a part of the multilayer semiconductor layer;

providing, on the buffer layer, a plurality of electrodes that include an electron injection electrode made of a material that injects an electron into the N-type Group 3-5 compound semiconductor when an electric field is applied thereto;

measuring an electric current flowing through a first pair of electrodes or a voltage generated between the electrodes of the first pair when a voltage or an electric current is applied to the first pair of electrodes, the first pair of electrodes being selected from the plurality of electrodes and including at least one electron injection electrode; and measuring a leakage current or a dielectric breakdown voltage caused by electron migration in the semiconductor wafer based on the current flowing through the electrodes of the first pair or the voltage generated between the first pair of electrodes.

* * * * *